United States Patent
Adam et al.

(10) Patent No.: US 8,815,656 B2
(45) Date of Patent: Aug. 26, 2014

(54) SEMICONDUCTOR DEVICE AND METHOD WITH GREATER EPITAXIAL GROWTH ON 110 CRYSTAL PLANE

(71) Applicant: International Business Machines Corporation, Armonk, NY (US)

(72) Inventors: Thomas N. Adam, Slingerlands, NY (US); Kangguo Cheng, Schenectady, NY (US); Judson R. Holt, Wappingers Falls, NY (US); Keith H. Tabakman, Fishkill, NY (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 13/622,614

(22) Filed: Sep. 19, 2012

(65) Prior Publication Data

US 2014/0077275 A1    Mar. 20, 2014

(51) Int. Cl.
*H01L 21/00* (2006.01)
*H01L 21/20* (2006.01)
*H01L 21/02* (2006.01)
*H01L 21/8238* (2006.01)

(52) U.S. Cl.
CPC .......... *H01L 21/20* (2013.01); *H01L 21/02647* (2013.01); *H01L 21/02293* (2013.01); *H01L 21/823807* (2013.01)
USPC .............. 438/150; 438/41; 438/44; 438/149; 438/245; 438/300

(58) Field of Classification Search
CPC .................. H01L 21/02647; H01L 21/823807; H01L 21/02293; H01L 21/20
USPC .................... 438/149, 150, 41, 44, 245, 300; 257/592, 929
See application file for complete search history.

(56) References Cited

U.S. PATENT DOCUMENTS

| | | | |
|---|---|---|---|
| 7,851,865 B2 | 12/2010 | Anderson et al. | |
| 7,867,860 B2 | 1/2011 | Huang et al. | |
| 7,910,994 B2 | 3/2011 | Yu et al. | |
| 7,939,398 B2 | 5/2011 | Wasshuber et al. | |
| 8,043,920 B2 | 10/2011 | Chan et al. | |
| 8,461,034 B2* | 6/2013 | Anderson et al. | 438/530 |
| 2004/0241916 A1 | 12/2004 | Chau et al. | |
| 2004/0266076 A1 | 12/2004 | Doris et al. | |
| 2005/0093021 A1* | 5/2005 | Ouyang et al. | 257/194 |
| 2005/0099304 A1* | 5/2005 | Humphrey | 340/572.8 |
| 2007/0249114 A1 | 10/2007 | Chen et al. | |
| 2009/0212366 A1 | 8/2009 | Chang et al. | |
| 2011/0049568 A1 | 3/2011 | Lochtefeld et al. | |
| 2011/0101455 A1 | 5/2011 | Basker et al. | |
| 2011/0193141 A1 | 8/2011 | Lin et al. | |
| 2012/0104511 A1 | 5/2012 | Chan et al. | |

OTHER PUBLICATIONS

International Search Report and Written Opinion, PCT/US2013/060569, Dec. 27, 2013.

* cited by examiner

*Primary Examiner* — Long K Tran
(74) *Attorney, Agent, or Firm* — Katherine S. Brown; Steven M. Kellner

(57) ABSTRACT

A semiconductor processing method is provided which promotes greater growth on <110> crystallographic planes than on other crystallographic planes. Growth rates with the process can be reversed compared to typical epitaxial growth processes such that the highest rate of growth occurs on <110> crystallographic planes and the least amount of growth occurs on <100> crystallographic planes. The process can be applied to form embedded stressor regions in planar field effect transistors, and the process can be used to grow semiconductor layers on exposed wall surfaces of adjacent fins in source-drain regions of finFETs to fill spaces between the fins.

22 Claims, 5 Drawing Sheets

SEMICONDUCTOR DEVICE AND METHOD WITH GREATER EPITAXIAL GROWTH ON 110 CRYSTAL PLANE

BACKGROUND OF THE INVENTION

1. Field of the Invention

The present invention relates to semiconductor devices and their manufacture, including but not limited to a method of making field effect transistors (FETs) such as FETs having embedded stressor elements and FETs of the finFET type.

2. Description of the Related Art

Various types of semiconductor devices incorporate epitaxial semiconductor layers to provide essential function therein. An epitaxial layer is a layer of monocrystalline semiconductor material which grows outward from an exposed surface of an existing monocrystalline semiconductor region or layer. An epitaxial semiconductor layer can be grown on an exposed semiconductor surface which coincides with a major surface of a wafer. The epitaxial layer may have the same composition as the semiconductor region on which it is grown, e.g., the semiconductor material, impurities, e.g., dopants and their concentrations, or the compositions of the epitaxial layer and the underlying semiconductor region can be different. Sometimes, the epitaxial layer has characteristics that allow the epitaxial layer to impart a stress to the semiconductor region on which it is grown. For example, an epitaxial semiconductor layer can impart a stress to an adjacent semiconductor region when the epitaxial semiconductor region comprises a semiconductor alloy material different from the adjacent semiconductor region such that epitaxial layer has a different crystal lattice constant than the lattice constant of the adjacent semiconductor region.

Sometimes, a second epitaxial layer is grown on top of a first epitaxial semiconductor layer, and sometimes one or more additional layers are grown thereon in layer upon layer fashion in making a semiconductor device. FIG. 1 illustrates one possible result when epitaxial layers of semiconductor material are grown within an opening 12 in a semiconductor region 10, the opening having a lower surface 13 defining a depth of the opening from a major surface 14 of the semiconductor region. The opening may also have interior surfaces, e.g., walls 16 which rise in a direction from the lower surface 13 towards the major surface 14. These walls 16 can extend in a vertical direction away from the major surface 14 or the lower surface 13 or both, or may extend in one or more other directions which rise from the lower surface towards the major surface.

As epitaxial growth processes tend to promote growth of a semiconductor layer on exposed <100> crystallographic planes of a semiconductor wafer which is parallel to the major surface of the wafer, a structure such as seen in FIG. 1 may result when first and second epitaxial layers 18, 20 are grown successively within the opening 12.

In such example, growth of the layer 18 on the lower surface 13 at which the <100> crystallographic plane of the semiconductor region is exposed and growth on the wall surfaces 16 at which the <110> crystallographic plane is exposed may occur with about the same rate. As a result, the thickness of the layer 18 overlying the lower surface 13 is about the same as the thickness of the layer 18 overlying each of the wall surfaces 16. The thickness of the resulting layer 18 may even be greater on the lower surface 13 than on the wall surfaces 16. The second layer 20 is grown onto the first epitaxial layer 18 thereafter. The second layer may serve a different purpose than the first layer, and the dopant concentrations of the layers 18, 20 may be different. Further processing may be performed to provide an electrically conductive path within the semiconductor material from the underlying semiconductor region 10 to the second epitaxial layer 20. For example, an anneal can be performed, which among other results, can cause dopant which may exist in higher concentration in the underlying semiconductor region 10 to diffuse upward from the semiconductor region 10 across lower surface 13 into the first layer 18. However, when the first layer 18 has a relatively low dopant concentration and the thickness of the first layer 18 adjacent the lower surface is relatively high, this can make it difficult to form the electrically conductive path between the semiconductor region 10 and the second layer 20.

FIG. 2 illustrates another structure 30 where an epitaxial semiconductor layer needs to be grown on wall surfaces of an existing semiconductor region. In such example, the semiconductor region can include a plurality of parallel fins 32 which rise above a surface 33 of an underlying oxide layer, such as a buried oxide (BOX) layer 34. The fins 32 in such example can be fins which extend into a source-drain region of a finFET having the same fins with gates overlying the fins in a gate region 28, for example. In the source-drain region, the finFET may include epitaxial layers 38 which fill in the space between adjacent fins 32 to form a continuous source-drain region of semiconductor material.

In this case, the epitaxial layer does not grow on the BOX layer. However, because growth must occur primarily on wall surfaces 36 of the fins which are exposed <110> crystallographic planar surfaces, the epitaxial layer 38 grows faster at locations of the wall surfaces 36 which are not very close to the BOX layer. As a result, the epitaxial layers 38 on fins 32 which are directly adjacent to one another grow together to form a seam 40 at locations well above the BOX layer surface 33, so that voids 42 remain in the epitaxial layers 38 adjacent to the BOX layer surface 33. It is undesirable for voids to remain in the structure because impurities may become trapped or concentrated therein, and voids may lead to premature failure or performance degradation. In addition, because the semiconductor material of the epitaxial layer 38 is missing at the bottoms of the fins adjacent the BOX layer surface 33, there is no semiconductor material present there as a source of dopant available to diffuse into the fins 32 during a subsequent drive-in anneal which can be performed after growing the epitaxial layer 38. This too can be undesirable.

Thus, it would be desirable to provide improvements to a process of forming epitaxial layers on wall surfaces, e.g., exposed <110> crystallographic plane surfaces, of semiconductor regions.

SUMMARY OF THE INVENTION

A semiconductor processing method is provided which can include epitaxially growing a semiconductor layer on a first surface of a first semiconductor region, the first surface oriented in a <110> crystallographic plane of the first semiconductor region, and the first surface extending in direction away from a second surface oriented in a <100> crystallographic plane of the first semiconductor region. The epitaxially growing can be performed under conditions which promote higher growth rate on the <110> crystallographic plane than on the <100> crystallographic plane so as to grow the semiconductor layer on the first surface at a location spaced from the second surface to a first thickness in a first direction normal to the first surface and to a second thickness less than the first thickness on the second surface at a location spaced from the first surface, the second thickness being in a second direction normal to the second surface.

In accordance with one or more examples, the first thickness of the semiconductor layer can be at least five times greater than the second thickness.

In accordance with one or more examples, the first surface can be an interior sidewall of a trench formed in the first semiconductor region and the second surface can be a lower interior surface of the trench.

In accordance with one or more examples, the step of epitaxially growing the semiconductor layer can include epitaxially growing a semiconductor alloy material onto at least the first surface.

In accordance with one or more examples, the step of epitaxially growing the semiconductor layer can include in situ doping the semiconductor layer with at least one of carbon and boron.

In accordance with one or more examples, the step of epitaxially growing the semiconductor layer can form an undoped semiconductor layer.

In accordance with one or more examples, the method can further include epitaxially growing a second semiconductor layer overlying a surface of the undoped semiconductor layer and overlying the first semiconductor region.

In accordance with one or more examples, the method can further include annealing to cause dopant to diffuse between the first semiconductor region and the second semiconductor layer to electrically link up the first semiconductor region and second semiconductor layer.

In accordance with one or more examples, the semiconductor layer can be a first semiconductor layer, and the method further comprising epitaxially growing a second semiconductor layer overlying a surface of the first semiconductor layer. The second semiconductor layer may be configured to apply a stress to the first semiconductor region and may be more heavily doped than the first semiconductor layer.

In accordance with one or more examples, the first surface can be an upwardly extending surface of a fin of the first semiconductor region which extends upwardly away from a surface of a buried oxide (BOX) layer.

In accordance with one or more examples, the fin can be a first fin and the first semiconductor region may have a plurality of fins including the first fin and a second fin adjacent to the first fin. The second fin can have an upwardly extending first surface facing the first surface. The step of epitaxially growing may simultaneously grow the semiconductor layer on the first surface of the second fin.

In accordance with one or more examples, the epitaxially growing can be performed so as to fill a space defined by the first surfaces of the first and second fins.

In accordance with one or more examples, the epitaxially growing can be performed such that the thickness of the semiconductor layer in the first direction on the first surfaces of the first and second fins can be uniform irrespective of distance along each first surface from the second surface.

In accordance with one or more examples, the step of epitaxially growing can be performed in a manner which produces no void larger than 1 nanometer in dimension in any direction between the semiconductor layer and the BOX layer.

In accordance with one or more examples, the step of epitaxially growing the semiconductor layer is performed at a pressure greater than 150 torr.

In accordance with one or more examples, the step of epitaxially growing the semiconductor layer can be performed at a pressure between 150 and 600 torr.

In accordance with one or more examples, the step of epitaxially growing the semiconductor layer can be performed at a pressure between 200 and 400 torr.

In accordance with an aspect of the invention, a method of fabricating a transistor is provided which may include epitaxially growing a semiconductor layer of semiconductor material on an interior sidewall of a trench formed in a first semiconductor region, the interior sidewall oriented in a <110> crystallographic plane of the first semiconductor region, wherein the interior sidewall extends in an upward direction away from a lower interior surface of the trench oriented in a <100> crystallographic plane of the first semiconductor region. In such method, the epitaxially growing can be performed under conditions which promote higher growth rate on the <110> crystallographic plane than on the <100> crystallographic plane so as to grow the semiconductor layer on the interior sidewall at a location spaced from the lower interior surface to a first thickness in a first direction normal to the interior sidewall and to a second thickness less than the first thickness on the second surface at a location spaced from the first surface, the second thickness being in a second direction normal to the second surface. The step of epitaxially growing the semiconductor layer may include epitaxially growing a semiconductor alloy material overlying at least the interior sidewall of the trench. The semiconductor alloy material may include an alloy of a semiconductor material of the first semiconductor region with at least one other semiconductor material. The method may further include growing a second semiconductor region on a surface of the semiconductor layer by epitaxially growing a semiconductor alloy material overlying the lower interior surface and the interior sidewall of the trench. The second semiconductor region can be more heavily doped than the semiconductor layer and at least the second semiconductor region can be configured to apply a stress to the first semiconductor region. At least one of a source region or a drain region of a transistor can be disposed at least partly within the second semiconductor region. A channel region of the transistor can be disposed at least partly within the first semiconductor region.

In accordance with one or more examples, the step of epitaxially growing the semiconductor layer can be performed at a pressure greater than 150 torr.

In accordance with one or more examples, the step of epitaxially growing the semiconductor layer can be performed at a pressure between 150 and 600 torr.

In accordance with one or more examples, the first thickness of the semiconductor layer can be at least five times greater than the second thickness.

In accordance with one or more examples, the step of epitaxially growing the semiconductor layer forms an undoped semiconductor layer. The method may further comprise epitaxially growing a second semiconductor layer overlying a surface of the undoped semiconductor layer and overlying the first semiconductor region.

In accordance with one or more examples, the method may further include annealing to cause dopant to diffuse between the first semiconductor region and the second semiconductor layer to electrically link up the first semiconductor region and the second semiconductor layer.

In accordance with another aspect of the invention, a transistor is provided which can include a first semiconductor region of monocrystalline semiconductor material in which a channel region can be disposed. A second region of monocrystalline semiconductor material can be configured to apply a stress to the first semiconductor region, wherein at least one of a source region or a drain region of the transistor being disposed at least partly within the second region.

The second region may disposed at least partly within a trench in the first semiconductor region. The second region can include a layer of semiconductor material overlying and conforming to an interior sidewall of the trench, the interior sidewall oriented in a <110> crystallographic plane of a crystal of the first semiconductor region. The semiconductor layer may have a greater thickness overlying the interior sidewall than overlying a lower interior surface of the trench, and the lower interior surface may be oriented in a <100> crystallographic plane of the first semiconductor region.

In accordance with one or more examples, the semiconductor layer can be an undoped first semiconductor layer and the second region may further include a second semiconductor layer doped with at least one of carbon and boron overlying the first semiconductor layer.

In accordance with another aspect of the invention, a field effect transistor is provided which can include a first semiconductor region of monocrystalline semiconductor material comprising a plurality of parallel fins in which a channel region can be disposed with a gate overlying surfaces of the parallel fins. The first semiconductor region may have a source region and a drain region extending away from the channel region, and a semiconductor layer overlying confronting first surfaces of the parallel fins, the first surfaces oriented in a <110> crystallographic plane of the first semiconductor region extending in an upward direction away from a surface of a buried oxide (BOX) layer. The semiconductor layer may fill a space between the confronting first surfaces of the parallel fins so as to leave no void larger than one nanometer in dimension in any direction between the surface of the BOX layer and the semiconductor layer.

DETAILED DESCRIPTION

Figure 3:
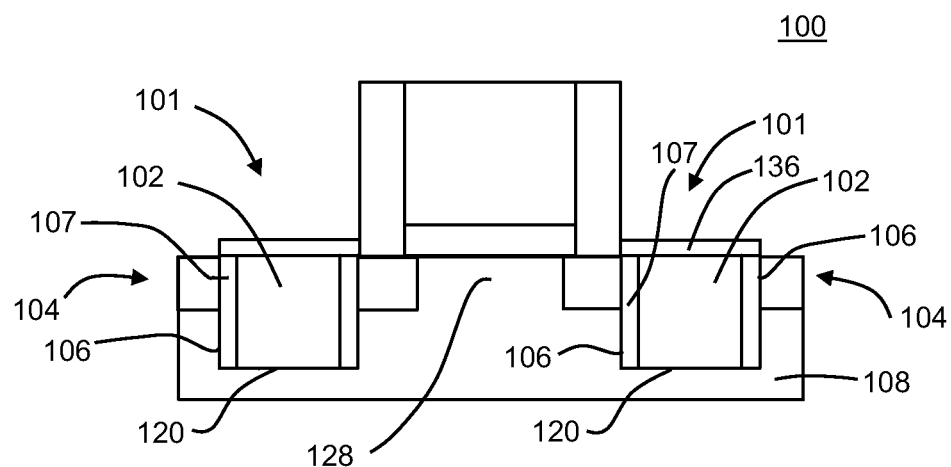
FIG. 3 illustrates a field effect transistor having embedded stressors therein in accordance with an embodiment of the invention.

FIG. 3 illustrates a field effect transistor (FET) 100 according to an embodiment of the invention which has embedded stressor regions 102 extending within openings 101, e.g., trenches, in the source-drain regions 104 of the transistor. The embedded stressor regions 102 may comprise a semiconductor alloy material such as silicon germanium or silicon carbon, for example, that is different from the semiconductor material of the surrounding semiconductor material region 108, which may in one example consist essentially of silicon. In such way, the stressor regions 102 may impart a stress to the channel region 128 of the FET which increases a mobility of carriers therein, and thus, improves transistor performance. As further seen in FIG. 3, an epitaxial buffer layer 107 can be disposed on the rising wall surfaces 106 of the openings. The wall surfaces may be exposed <110> crystallographic plane surfaces of the semiconductor region 108. Lower interior surfaces 120 of the openings may be exposed <100> crystallographic plane surfaces of the semiconductor region 108.

In one example, the buffer layer 107 may have a different dopant concentration than the stressor region 102, and may function as a buffer between the semiconductor material of surrounding region 108 and the stressor region 102 in terms of an amount of the alloying material, e.g., germanium or carbon, therein. As further seen in FIG. 3, the buffer layer 107 may have a uniform, e.g., essentially constant, thickness, overlying the wall surfaces 106 and may be absent from, or have relatively little thickness overlying the lower surface 120. In one example, the thickness of the layer 107 in a direction normal to the wall surfaces 106 of the opening may be at least five times greater than the thickness of the layer 107 in a direction normal to the lower surface 120 of the semiconductor region 108. The relative thicknesses on the <100> and <110> crystallographic planes can be achieved for a variety of deposited semiconductor layers having a variety of dopant concentrations or amount of alloying material therein. A cap layer 136 of semiconductor material which may also be a semiconductor alloy of the same kind as the stressor region 102 may overlie the stressor region 102.

Figure 4:
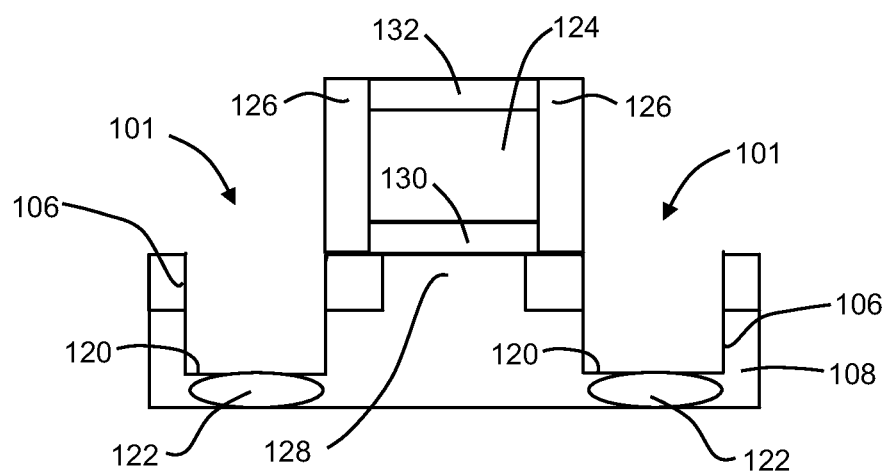
FIGS. 4 through 6 illustrate steps in a method of fabricating a FET according to an embodiment of the invention.

FIG. 4 illustrates a stage in fabrication of the transistor shown in FIG. 3. As seen therein, a gate 124 of the transistor and spacers 126 thereon are formed overlying a semiconductor region 108 having a portion which will become a channel region 128 of the transistor. A dielectric cap layer 132 may overlie the gate 124. The channel region 128 may be separated from the gate 124 by a gate dielectric layer 130. FIG. 4 shows a stage of fabrication after openings, e.g., trenches 101 have been formed in the semiconductor region 108, such as by etching using the gates with the spacers 126 thereon as an etch mask. There can be <110> crystallographic planes exposed at wall surfaces 106 and <100> crystallographic planes exposed at lower interior surfaces 120. There may be other interior wall surfaces of the openings 101 at which <111> crystallographic planes are exposed and which extend away from the major surface of the semiconductor region. These surfaces are not visible in the sectional view shown in FIG. 4. The <111> plane surfaces extend at a 54 degree angle to the <100> plane.

Figure 5:
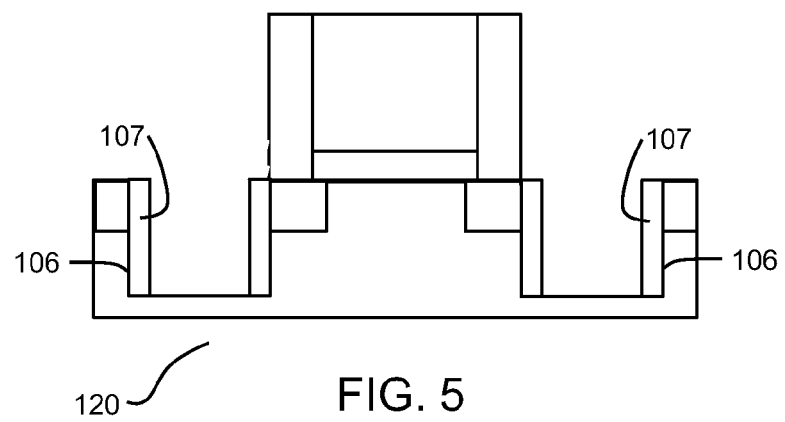

FIG. 5 illustrates formation an epitaxial layer 107 on the interior wall surfaces by epitaxial growth thereon. In one example, the layer 107 can be doped with at least one of carbon, phosphorus or boron. In one example, the layer 107 may comprise silicon alloyed with another semiconductor such as germanium or carbon for imparting a stress to the semiconductor region 108. In one example, the percentage of germanium may range from 10 percent to 90 percent, and in a particular example, may be between 20 and 65 percent. The layer 107 may also grow on surfaces (not shown) of the semiconductor region at which <111> crystallographic planes are exposed, but typically grows to a much smaller thickness thereon than on the surfaces 106 at which the <110> crystallographic plane is exposed. Very little to no growth is seen on the lower surface 120 at which the <100> crystallographic plane is exposed. The buffer layer 107 typically has a significantly lower dopant concentration than the dopant concentration of a subsequently formed layer thereon which fills the opening 101 to form the stressor region 102 as shown in FIG. 3. In one example, the layer 107 may be one that is "undoped", i.e., one which is formed while supplying relatively little or no dopant into the deposition chamber while growing the layer 107. In such case, layer 107 can be a "buffer layer" available to help avoid an excessively heavy concentration of the dopant arising at boundaries of the stressor regions with the surrounding semiconductor regions 108.

Deposition conditions which promote higher growth rate of layer on exposed <110> plane surfaces (on walls 106) than on the <100> plane surfaces (on lower interior surface 120), and on any exposed <111> plane surfaces can be as follows.

Relatively high chamber pressure of greater than 150 torr: for example, 200 torr, is required by supply of a relatively high flow rate of hydrogen to the deposition chamber, i.e., a flow rate of hydrogen greater than 10 standard liters per minute (slm). In one example, the chamber pressure during deposition can be controlled to a value between 150 and 600 torr; however, it may be advantageous to control the chamber pressure to between 200 and 400 torr. A dichlorosilane (DCS, i.e., $SiH_2Cl_2$) precursor is supplied to the deposition chamber at a much lower flow rate such as greater than 25 standard cubic centimeters per minute (sccm) with a flow rate of GeH4 (germane) greater than 2 sccm for a 10% flow rate of germane relative to the flow rate of the DCS precursor. In one example, germane can be supplied to the chamber in a diluted form. For example, when germane is supplied to the chamber in a 10% diluted mixture with one or more other gases, the flow rate of such diluted mixture to the chamber can be controlled to a quantity greater than 20 sccm such that the quantity of germane within the mixture admitted into the chamber is greater than 2 sccm. In a particular example, the flow rates of each of these precursor materials to the chamber, i.e., DCS on the one hand, and the above-mentioned 10% diluted germane mixture, can each be controlled to 25 sccm. In addition, hydrochloric acid can also be supplied to the chamber during the deposition, at a flow rate greater than 30 sccm. In one example, the flow rate of hydrochloric acid can range between 30 and 270 sccm.

Figure 6:
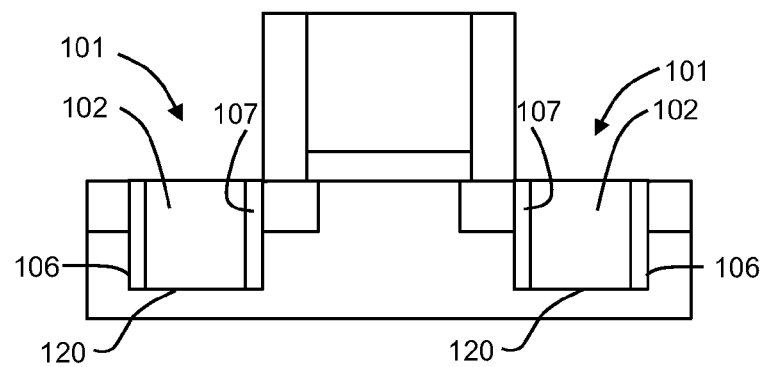

After forming the layer 107 on wall surfaces 106, deposition conditions can be changed to other conditions which tend to fill the openings 101 from the lower surface 120 upward, and which in time form a second layer or additional region filling the openings 101 as shown in FIG. 6 to form the stressor regions 102. While reference is made to a "second layer" it will be understood that the second layer referred to herein need only be formed some time after the layer 107 is formed, whether or not one or more other layers is formed between the step of forming the layer 107 and the forming of the second layer. When forming the second layer, in one example, the supply of a dopant to the chamber can be adjusted to provide a higher dopant concentration such as greater than 1E20 (i.e., greater than $1.0 \times 10^{20}$ cm$^{-3}$) for this second layer of the stressor regions 102. In one example, the chamber pressure can be changed to between 5 and 20 torr to promote highest growth rate on the <100> plane surface of the lower surface 120 to fill the openings 101 once the buffer layer 107 has been formed. Referring again to FIG. 3, once the openings have been filled, a cap layer 136, which may have a lower concentration of alloying material, e.g., germanium or carbon, than the main stressor region 102 can be grown as a further epitaxial layer thereon. In one example, the alloying material in the cap layer 136 may have a concentration about half that of the material in the second layer of the stressor regions 102.

In one example, the smaller thickness or absence of the layer 107 above the lower surface 120 can facilitate a process of forming an electrical connection between the semiconductor region 108 just below the openings 101 and the second layer of the stressor regions 102 with the semiconductor region 108. As shown in FIG. 4, a butting dopant implant 122 into the semiconductor region 108 can be performed at various times and under appropriately varied conditions, e.g., before or after forming openings 101, and before or after forming the epitaxial layer 107 and second layer therein, and prior to annealing the structure shown in FIG. 6. Due to the annealing process, dopant in the butting implant can diffuse therefrom to form an electrically conductive path, i.e., electrically link up the semiconductor region 108 with the stressor regions 102. The smaller thickness of the layer 107 overlying the lower surface 120 as a result of the deposition process disclosed herein reduces the distance that dopant atoms must travel during the anneal to electrically link up the semiconductor region 108 and the second layer of the stressor regions 102.

FIGS. 7-10 illustrate stages in a method which utilizes the above-described process for growing an epitaxial layer to a greater thickness on exposed <110> crystallographic planes to form epitaxial layers on wall surfaces 206 of fins 208, such as may be disposed in source-drain regions which include fins that will be part of a finFET when completed.

Figure 7:
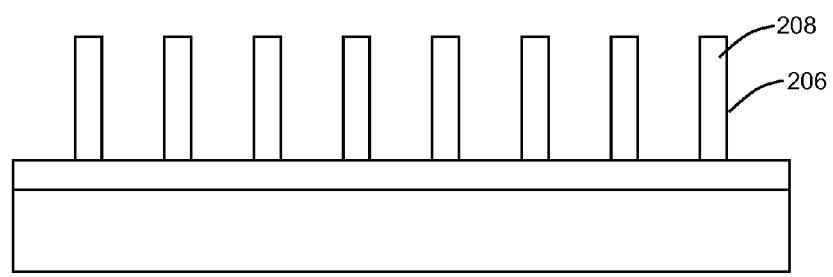
FIGS. 7 through 10 illustrate steps in a method of forming epitaxial layers on fins of a finFET according to an embodiment of the invention.
Figure 8:
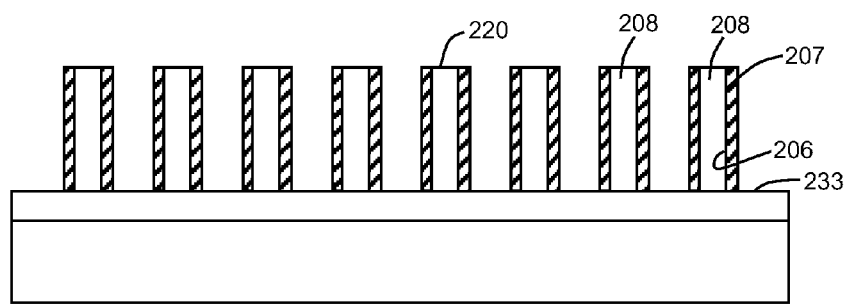
Figure 9:
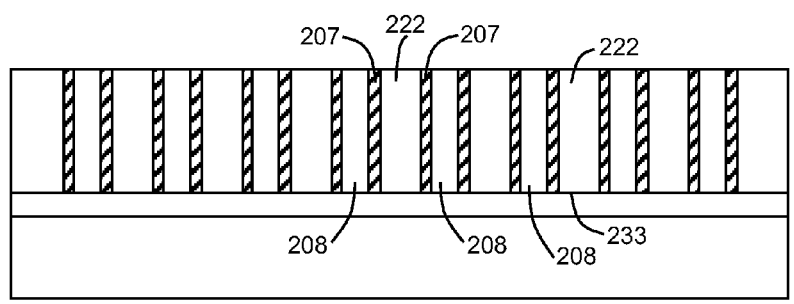

As seen in FIG. 7, fins 208 may rise upwardly above a surface 233 of a buried oxide (BOX) layer 234. Subsequently, as seen in FIG. 8, a first epitaxial layer 207 can be grown on exposed wall surfaces 206 at which crystallographic planes <110> are exposed. Deposition conditions can be the same as described above for the case of the FET having the embedded stressor regions. However, in some cases layer 207 may have a dopant concentration which exceeds the dopant concentration in the fins. In addition, as further described below, when layer 207 is available as a source of dopant during a subsequent drive-in anneal, the layer 207 may in some cases have a different type of dopant, i.e., one of n-type or p-type, which is different from the dopant type present in the fins. Accordingly, a subsequent drive-in anneal may distribute dopant from layer 207 having a higher concentration into the fins thereby changing the predominant dopant type of the fins to the same dopant type as the layer 207.

Figure 1:
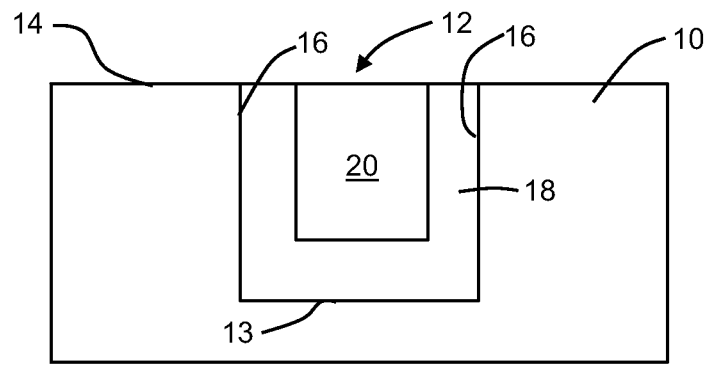
FIGS. 1 and 2 illustrate structures with epitaxial layers thereon in accordance with the prior art.
Figure 2:
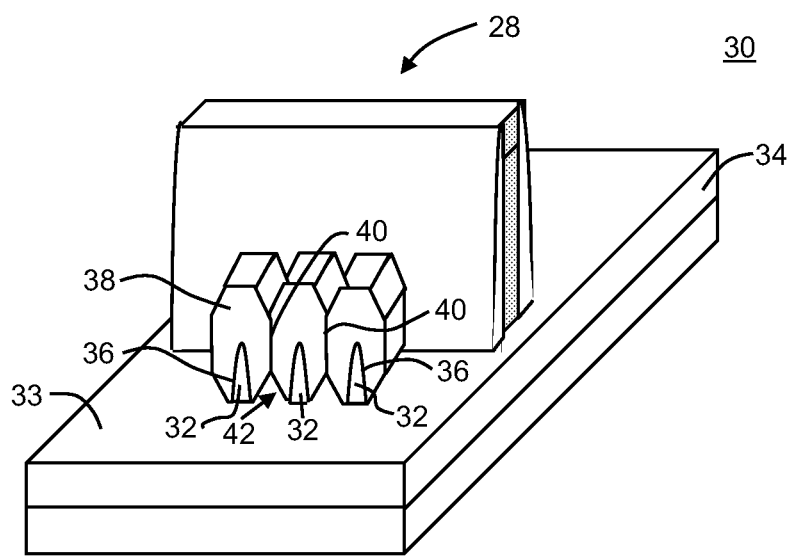

As in the above example, under these deposition conditions, the first layer 207 grows to a uniform thickness overlying the wall surfaces 206 of the fins 208. As also seen in FIG. 8, little to no growth is seen at the top surfaces 220 of the fins which extend away from the wall surfaces and at which the <100> crystallographic planes are exposed. As further seen in FIG. 9, one or more further epitaxial layers represented by regions 222 can be grown on the layer 207 under the above-described conditions which promote highest growth rate on exposed <110> crystallographic planes. Under such conditions, the epitaxial layers represented at 207, 222 may fill the spaces between adjacent fins 208 so as to leave no void greater than one nanometer in dimension in any direction between the surface 233 of the BOX layer and any of the one or more epitaxial layers. This can be especially beneficial in addressing a problem described above relative to FIG. 2 of voids remaining adjacent the BOX layer after deposition. In addition, the epitaxial formation process herein provides a uniform distribution of epitaxial material around each of the fins, which epitaxial material can be doped. In this, way, the epitaxial layer formation process herein can help ensure a more uniform dopant distribution when the structure is subjected to a subsequent drive-in anneal which distributes a dopant in the epitaxial layer within the structure, such as into the fins 208.

Figure 10:
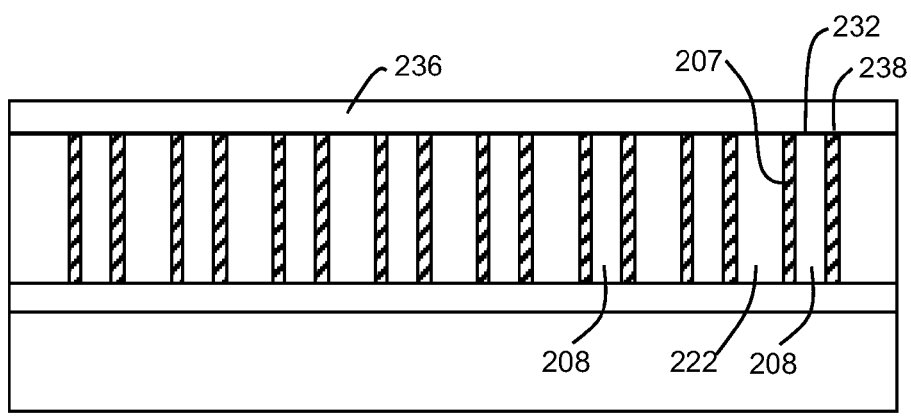

FIG. 10 shows that in a further step of fabrication a cap layer 236 can be formed over the fins 208 under altered deposition conditions which promote growth on exposed <100> crystallographic planes which correspond to top surfaces 232, 238 of the fins 208 and the epitaxial layers 207, 222. In one example, the chamber pressure can be lowered to a range between 5 and 20 torr when forming the cap layer 236.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A semiconductor processing method, comprising:
epitaxially growing a semiconductor layer on a first surface of a first semiconductor region, the first surface oriented in a 110> crystallographic plane of the first semiconductor region, and the first surface extending in direction away from a second surface oriented in a 100> crystallographic plane of the first semiconductor region, the epitaxially growing performed under conditions which promote higher growth rate on the 110> crystallographic plane than on the 100> crystallographic plane so as to grow the semiconductor layer on the first surface at a location spaced from the second surface to a first thickness in a first direction normal to the first surface and to a second thickness less than the first thickness on the second surface at a location spaced from the first surface, the second thickness being in a second direction normal to the second surface; and
wherein the first surface is an interior sidewall of a trench formed in the first semiconductor region and the second surface is a lower interior surface of the trench.

2. The method of claim 1, wherein the first thickness of the semiconductor layer is at least five times greater than the second thickness.

3. The method of claim 1, wherein the step of epitaxially growing the semiconductor layer includes epitaxially growing a semiconductor alloy material onto at least the first surface.

4. The method of claim 1, wherein the step of epitaxially growing the semiconductor layer includes in situ doping the semiconductor layer with at least one of carbon and boron.

5. The method of claim 1, wherein the step of epitaxially growing the semiconductor layer forms an undoped semiconductor layer.

6. The method of claim 5, further comprising epitaxially growing a second semiconductor layer overlying a surface of the undoped semiconductor layer and overlying the first semiconductor region.

7. The method of claim 6, further comprising annealing to cause dopant to diffuse between the first semiconductor region and the second semiconductor layer to electrically link up the first semiconductor region and second semiconductor layer.

8. The method of claim 1, wherein the semiconductor layer is a first semiconductor layer, the method further comprising epitaxially growing a second semiconductor layer overlying a surface of the first semiconductor layer, the second semiconductor layer being configured to apply a stress to the first semiconductor region and being more heavily doped than the first semiconductor layer.

9. The method of claim 1, wherein the first surface is an upwardly extending surface of a fin of the first semiconductor region which extends upwardly away from a surface of a buried oxide (BOX) layer.

10. The method of claim 9, wherein the fin is a first fin and the first semiconductor region has a plurality of fins including the first fin and a second fin adjacent to the first fin, the second fin having an upwardly extending first surface facing the first surface, wherein the epitaxially growing simultaneously grows the semiconductor layer on the first surface of the second fin.

11. The method of claim 10, wherein the epitaxially growing is performed so as to fill a space defined by the first surfaces of the first and second fins.

12. The method of claim 11, wherein the epitaxially growing is performed such that the thickness of the semiconductor layer in the first direction on the first surfaces of the first and second fins is uniform irrespective of distance along each first surface from the second surface.

13. The method of claim 12, wherein said epitaxially growing is performed in a manner which produces no void larger than 1 nanometer in dimension in any direction.

14. The method of claim 1, wherein the step of epitaxially growing the semiconductor layer is performed at a pressure greater than 150 torr.

15. The method of claim 14, wherein the step of epitaxially growing the semiconductor layer is performed at a pressure between 150 and 600 torr.

16. The method of claim 15, wherein the step of epitaxially growing the semiconductor layer is performed at a pressure between 200 and 400 torr.

17. A method of fabricating a transistor, comprising:
epitaxially growing a semiconductor layer of semiconductor material on an interior sidewall of a trench formed in a first semiconductor region, the interior sidewall oriented in a <110> crystallographic plane of the first semiconductor region, and the interior sidewall extending in an upward direction away from a lower interior surface of the trench oriented in a <100> crystallographic plane of the first semiconductor region, the epitaxially growing performed under conditions which promote higher growth rate on the <110> crystallographic plane than on the <100> crystallographic plane so as to grow the semiconductor layer on the interior sidewall at a location spaced from the lower interior surface to a first thickness in a first direction normal to the interior sidewall and to a second thickness less than the first thickness on the second surface at a location spaced from the first surface, the second thickness being in a second direction normal to the second surface, wherein the step of epitaxially growing the semiconductor layer includes epitaxially growing a semiconductor alloy material overlying at least the interior sidewall of the trench, the semiconductor alloy material including an alloy of a semiconductor material of the first semiconductor region with at least one other semiconductor material; and
epitaxially growing a second semiconductor region on a surface of the semiconductor layer by epitaxially growing a semiconductor alloy material overlying the lower interior surface and the interior sidewall of the trench,
wherein the second semiconductor region is more heavily doped than the semiconductor layer and at least the second semiconductor region is configured to apply a stress to the first semiconductor region, at least one of a source region or a drain region of a transistor is disposed at least partly within the second semiconductor region, and a channel region of the transistor is disposed at least partly within the first semiconductor region.

18. The method of claim 17, wherein the step of epitaxially growing the semiconductor layer is performed at a pressure greater than 150 torr.

19. The method of claim 17, wherein the step of epitaxially growing the semiconductor layer is performed at a pressure between 150 and 600 torr.

20. The method of claim 17, wherein the first thickness of the semiconductor layer is at least five times greater than the second thickness.

21. The method of claim 17, wherein the step of epitaxially growing the semiconductor layer forms an undoped semiconductor layer, the method further comprising epitaxially growing a second semiconductor layer overlying a surface of the undoped semiconductor layer and overlying the first semiconductor region.

22. The method of claim 21, further comprising annealing to cause dopant to diffuse between the first semiconductor region and the second semiconductor layer to electrically link up the first semiconductor region and the second semiconductor layer.

* * * * *